United States Patent [19]

Lin et al.

[11] Patent Number: 5,053,357
[45] Date of Patent: Oct. 1, 1991

[54] METHOD OF ALIGNING AND MOUNTING AN ELECTRONIC DEVICE ON A PRINTED CIRCUIT BOARD USING A FLEXIBLE SUBSTRATE HAVING FIXED LEAD ARRAYS THEREON

[75] Inventors: Paul T. Lin; Michael B. McShane, both of Austin, Tex.

[73] Assignee: Motorola, Inc., Schaumburg, Ill.

[21] Appl. No.: 567,838

[22] Filed: Aug. 14, 1990

Related U.S. Application Data

[62] Division of Ser. No. 457,648, Dec. 27, 1989.

[51] Int. Cl.<sup>5</sup> ............................................. H01L 21/60
[52] U.S. Cl. ...................................... 437/204; 437/211
[58] Field of Search ................ 437/211; 361/398, 408; 174/52; 357/80, 70, 72, 74, 68

[56] References Cited

U.S. PATENT DOCUMENTS

| | | | |
|---|---|---|---|
| 3,718,969 | 3/1973 | Segerson | 437/218 |
| 3,911,568 | 8/1975 | Hartleroad et al. | 437/217 |
| 4,411,719 | 10/1983 | Lindberg | 437/8 |
| 4,742,431 | 5/1988 | Igarashi | 361/398 |
| 4,744,009 | 5/1988 | Grabbe et al. | 361/398 |
| 4,766,670 | 8/1988 | Gazdik et al. | 437/205 |
| 4,783,719 | 11/1988 | Jamison et al. | 361/398 |
| 4,792,532 | 12/1988 | Ohtani et al. | 437/8 |

FOREIGN PATENT DOCUMENTS 63-65635 3/1988 Japan ............................ 437/8

Primary Examiner—Olik Chaudhuri
Assistant Examiner—David E. Graybill
Attorney, Agent, or Firm—John A. Fisher

[57] ABSTRACT

An electronic component having a flexible substrate with conductive traces thereon may have the leads separated into arrays that are shaped to contact and be surface mounted to the bonding lands on a printed circuit board (PCB). The flexible substrate, such as polyimide, adheres to the traces and is formed into lead arrays with them. The lead arrays thus keep portions of the leads and the outer bonding areas corresponding thereto aligned with respect to each other during handling and mounting to the PCB. An alignment mechanism may be optionally present on the lead arrays that mates with a corresponding mechanism on the PCB. The package body itself may be overmolded, assembled from prior parts, etc. Another alternative version includes test points on the perimeter of the substrate beyond the outer bonding areas that may be used to test the device, such as an integrated circuit chip or die, at an intermediate stage in the assembly process. The periphery and test points may be sheared away before the package is mounted to the PCB. A variety of outer bonding area pitches may be provided on the same package with test points of a standard pitch. The relatively inexpensive device is thin and easily mounted by conventional techniques.

6 Claims, 3 Drawing Sheets

METHOD OF ALIGNING AND MOUNTING AN ELECTRONIC DEVICE ON A PRINTED CIRCUIT BOARD USING A FLEXIBLE SUBSTRATE HAVING FIXED LEAD ARRAYS THEREON

This is a division of application Ser. No. 07/457,648, filed Dec. 27, 1989.

FIELD OF THE INVENTION

The invention relates to electronic devices, and, in one aspect, more particularly relates to packages and containers for electronic devices such as integrated circuits, for example, that may be surface mounted on a printed circuit board and which are very thin.

BACKGROUND OF THE INVENTION

It is well known that an increasingly important consideration in the production and use of integrated circuits (ICs) is the package in which the IC resides. The module or casing in which the IC is packaged is a prominent factor in the ultimate cost, performance and lifetime of the IC. An important consideration as the circuits become more dense is that the number of leads to the package and connections from the leads to the integrated circuit pads increases; thus increasing the complexity of construction and adding to the cost of the end product, not just in terms of increased and more expensive materials, but also increased production costs. A package which has satisfactorily addressed the need of a large number of interconnections is the pin grid array (PGA) where a plurality of pins oriented normal to a relatively flat package body gives a "bed of nails" appearance. PGAs have proven popular when hundreds of connections must be made.

However, another factor affecting the design of IC packages is the advent of surface mount technology, whereby space is conserved on the printed circuit boards (PCBs) by mounting the packages directly on the conductive patterns of the circuit board, rather than by extending the leads through holes in the board. This technology is an additional influence in making the packages smaller, and making it more difficult to design a small package that will also contain a large number of leads. An additional problem with surface mount technology is that in addition to aligning the leads properly laterally, which is more difficult as the lead number increases, the leads must also be coplanar, that is, in the same plane or aligned in the vertical dimension so that the bonds to the surface bonding lands of the PCB pattern may be made without gaps or shorts.

Thus, a continuing purpose in the art of providing packages for electronic components, such as integrated circuits, is a package design that will address these multiple goals satisfactorily in an arrangement that can be reliably manufactured at the lowest cost. The lowest cost packages are those which have plastic bodies which can be molded from thermoplastic and thermoset materials.

Addressing all of these goals has proven difficult. It has been hard to surface mount a package containing large numbers of leads; PGAs must either be mounted through holes in the PCB or in a carrier that is in turn surface mounted. Additionally, PGAs are generally made of expensive ceramic materials, rather than the less expensive plastic compounds. Further, a large PGA with a relatively rigid structure having 500 leads or more would be subject to mechanical displacement over the package area as the PCB, and the package in turn, are mechanically flexed or subjected to non-uniform heating that would cause one flat area of the package to expand at a rate different than an adjacent area of the package. Such stresses could cause bonds to come loose causing shorts or could crack the package body undesirably providing entry to moisture and other contaminants. These stresses are aggravated when the package body is fabricated from a material that is considerably different from the PCB substrate, for example, where the package is ceramic and the board is plastic with different rates of thermal expansion. Thus, the issues of very large pin counts, thermal dissipation, surface mounting and low cost are intertwined.

SUMMARY OF THE INVENTION

Accordingly, it is an object of the present invention to provide an integrated circuit device that will have very large "pin" or connection counts, but have the connections on each side of the device remain physically flexible over its body to withstand lateral mechanical displacement due to thermal or physical causes.

It is another object of the present invention to provide a flexible IC device that permits a large number of connections that may be surface mounted to a PCB or even a flexible substrate.

Furthermore, an additional object is to provide a flexible device where the connectors on each side thereof can be adjusted or aligned with respect to the footprint on the substrate or PCB. That is, when the device is mounted on a flex circuit or PCB, the device lead arrays could be shifted toward one direction or another. Each side or array of connections can be adjusted to match the bonding lands.

It is yet another object of the present invention to provide a large array surface mounted device that can be tested prior to mounting and which, in one aspect, be adapted to a variety of "footprints".

Still another object is to devise a device family having a test contact configuration that is common within the family, even if the pitches of the outer bonding areas or the footprints are different from one device to another within the family.

In carrying out these and other objects of the invention, there is provided, in one form, an electronic device for surface mounting on substrate, such as a printed circuit board (PCB), having bonding lands which has an insulative, flexible substrate with a periphery, and an electronic component receiving area on the periphery. A plurality of electrically conductive traces are present on the substrate which extend from the electronic component receiving area to the periphery. The traces have inner bonding areas near the electronic component receiving area and outer bonding areas near the periphery. An electronic component, such as an integrated circuit die, having a plurality of bonding pads thereon, is affixed to the electronic component receiving area of the substrate. The bonding pads are electrically connected to the inner bonding areas. A package body surrounds at least the electronic component and the inner bonding areas. At least two groups of traces are formed into lead arrays to permit the outer bonding areas to contact and be bonded to the bonding lands on a PCB when the package is mounted thereon. The portions of the substrate bearing these shaped traces are also shaped and are part of the lead arrays.

It will be appreciated that in the Figures the proportions of the various parts may not be to scale. For example, the thicknesses of various components such as platings or coatings have been exaggerated for clarity. Additionally, the number of traces, bonding pads, test points, etc. illustrated have been greatly reduced for clarity, and it will be appreciated that the number of traces, bonding pads and other connections for an actual electronic package, especially one containing an integrated circuit, will be many times that depicted.

DETAILED DESCRIPTION OF THE INVENTION

Figure 1:
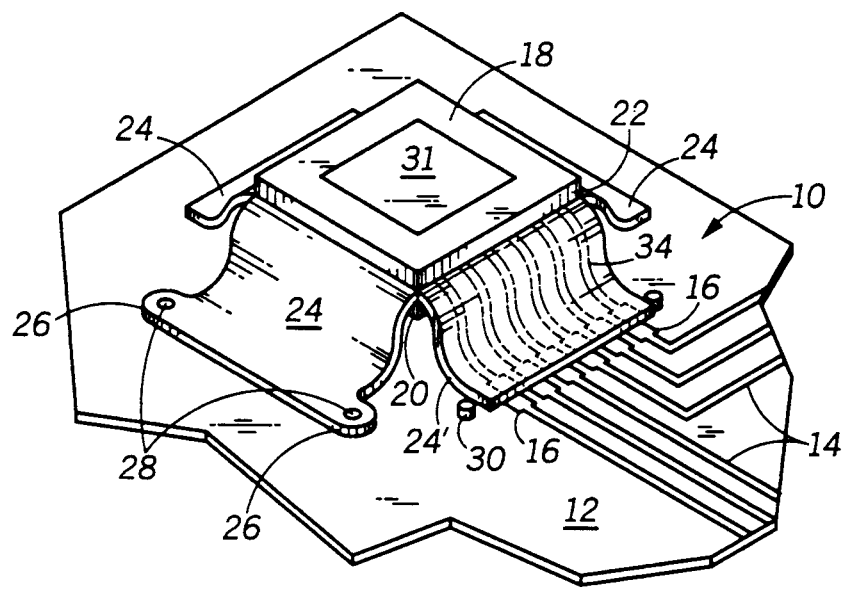
FIG. 1 is a three-quarters, perspective view of a thin, molded or adhesive encapsulated electronic device in accordance with the present invention that is surface mounted to a printed circuit board, partially shown.

It has been discovered that a thin, flexible substrate 32 bearing traces 34 (see FIG. 2) can be used within an electronic package to make it more resilient through thermal expansion cycles and physical handling and shocks. Shown in FIG. 1 is an illustration of one embodiment of the thin, molded electronic device 10 surface mounted to a printed circuit board (PCB) 12 having a plurality of traces 14 terminating in bonding lands 16. It will be appreciated that although the term PCB is used throughout the specification and claims herein, that the term is meant to include equivalents thereof, including but not necessarily limited to flex circuits. Indeed, the substrate 32 may be identical in materials and even in size to the PCB upon which it will be mounted.

Device 10 has a body 18, which in turn may comprise a base 20 that may be plastic molded over the electronic component (not shown in this Figure) and a cap 22. Extending from the package body 18 are a plurality of lead arrays 24 possessing a plurality of electrically conductive runners or traces terminating in outer bonding areas (not shown in this Figure) which are physically and electrically bonded to the bonding lands 16. The particular device 10 shown in FIG. 1 has a square shape with four sides, each having a lead array 24, and thus, they may be termed lead "quad" arrays since they number four. It will be appreciated, however, that device 10 may in some embodiments have more or less than four arrays 24. Each array may be provided with an alignment mechanism at some point thereon, which in the design illustrated in FIG. 1 are tabs 26 on each side of the array 24, where the tabs 26 have holes 28 designed to correspond and mate with posts 30 in the PCB 12 to properly position the leads with the bonding lands 16. Device 10 may also bear a heat spreader or heat sink 31 on its upper surface to help channel thermal energy from inside the package 10 to the outside.

Lead arrays 24 may be transparent or translucent as seen in array 24', and traces 34 may be visible therethrough. This option has the advantage of permitting visual inspection of the bonds made between traces 34 and lands 16.

Figure 2:
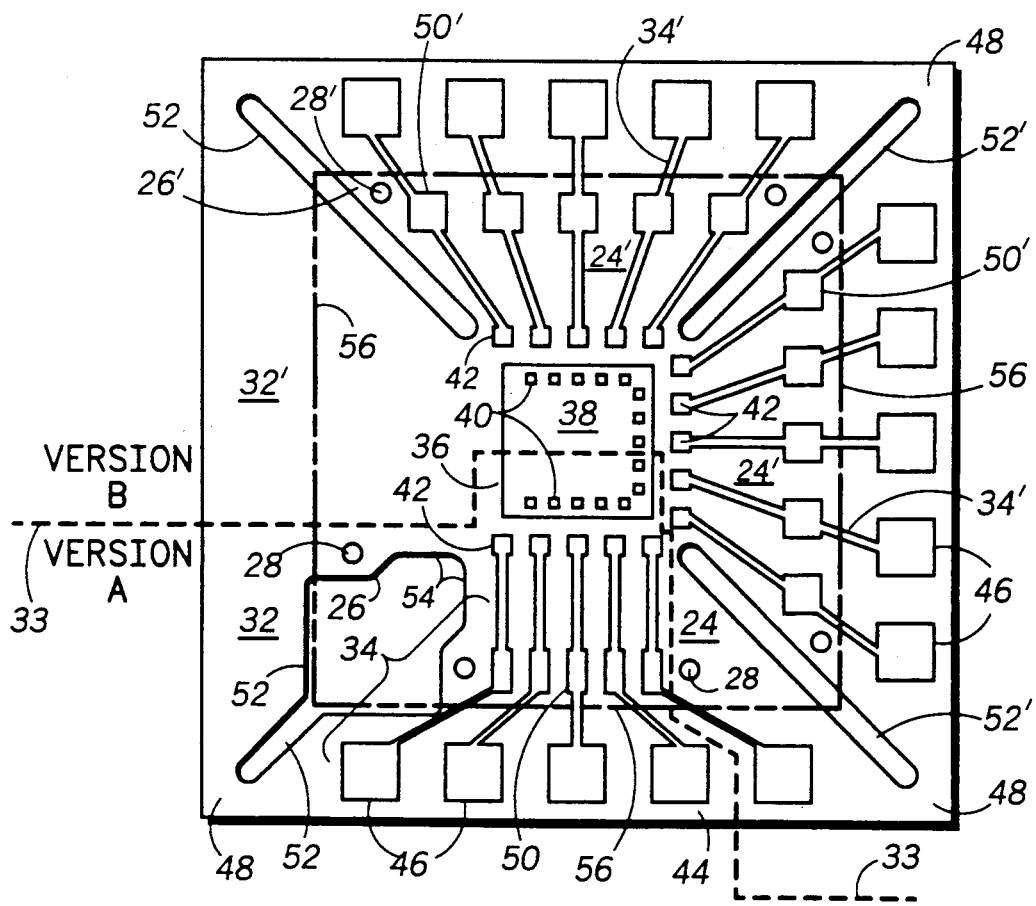
FIG. 2 is a plan view of the thin, flexible substrate of the present invention bearing traces of two different designs with separation slots.

Shown in FIG. 2 is a layout of a thin, flexible substrate 32 which will form the backing for the lead arrays 24 as will be explained. Two embodiments of the thin, flexible substrate 32 and 32' are depicted in FIG. 2, separated by a dashed line 33, as Version A and Version B, respectively. It will be understood that on an actual substrate, the entire substrate would be either the design seen in Version A, or that seen in Version B. However, in this way the differences and similarities between the two versions can be better appreciated.

Thin, flexible substrate 32/32' may be made from any very thin insulative material, such as those typically suitable for a tape automated bonding (TAB) backing layer or substrate. Polyimide is a representative material, but is certainly not the only one; it may be found under trade names such as Uplex or Kapton, among others. Other suitable materials include, but are not necessarily limited to polyester (lower in cost and performance than polyimide), Mylar and composites, such as a resin-filed epoxy or a fiber reinforced materials. The substrate should be a material that can bear a plurality of conductive traces 34/34' thereon which may be formed by any suitable method, including conventional ones not limited to plating, etching, photolithography, printing, etc. The material should also be flexible enough to be formed into the lead arrays 24 at a point late in the fabrication process as will be explained later. The adhesion of the substrate 32/32' to the traces 34/34' should also be great enough that the traces 34/34' will not delaminate or separate from the substrate 32/32' when the lead arrays 24 are formed.

In the Version A embodiment seen in the lower portion of FIG. 2, substrate 32 has an electronic component receiving area 36, which happens to be centrally located on the substrate 32 although it could be positioned elsewhere. While it will be appreciated that a wide variety of electronic components may be contained within the device 10 of the present invention, the invention may find one of its best uses as a package for integrated circuits. Thus, FIG. 2 shows an integrated circuit die 38 bearing a plurality of bonding pads 40 on its periphery, already die bonded to the integrated circuit die receiving area 36. It will also be appreciated that more than one chip 38 may be secured to the die receiving area and interconnected to the traces. Configured around the die receiving area 36 are a plurality of traces 34 which form a "lead frame" around the die 38, although it will be appreciated that these traces 34 are considerably thinner than what are conventionally thought of as leads in a lead frame. Traces 34 have inner bonding areas 42 arranged near or on die receiving area 36. At the outer periphery 44 of substrate 32 are a plurality of test points 46, one for each trace 34. Peripheries 44, which on a square substrate 32 number four are joined together at their ends by corners 48 such that a carrier structure or "ring" surrounds the die 38.

On the traces 34 intermediate the inner bonding areas 42 and the test points 46 are outer bonding areas 50. In Version A, traces 34 are perpendicular to the edge of die receiving area 36 and parallel to each other until they reach the outer bonding areas 50 at which point they fan out or radiate to test points 46. In this respect, Version B differs. Traces 34' of Version B immediately begin fanning out or radiating from inner bonding pads 42 to outer bonding areas 50' and continue radiating out to test points 46. In other words, although the end points of traces 34 and 34' are the same, the paths they take through differently positioned outer bonding areas 50 and 50', respectively, are different. This feature indicates, however, that outer bonding areas 50 may be at different pitches for different applications and the test points 46 remain at a the same or "standard" pitch for the test devices. It is anticipated that a plurality of outer bonding pads 50 may be arranged along traces 34, and that the end user may crop the periphery at a desired point to provide a device with leads at the correct pitch. This feature permits one package to be made for a variety of applications.

Separating the main quadrants of substrate 32 are slots 52 and 52' for Versions A and B, respectively. The shape of slots 52 and 52' depend on the shape of traces 34 and 34'. Because traces 34 are parallel and do not fan out between inner bonding areas 42 and outer bonding areas 50 as depicted in Version A of FIG. 2, slot 52 have sides 54 at a right angle to each other. When the carrier structure or ring comprising peripheries 44 and corners 48 is cropped away at line 56, rectangularly-shaped lead arrays 24 are formed which may be formed to give the appearance of arrays 24 in FIG. 1.

Slots 52' however, must have a more narrow design since traces 34' fan out between inner bonding areas 42 and outer bonding areas 50'. Version B would thus have trapezoidal-shaped lead arrays 24' when the peripheries 44, test points 46 and corners 48 are cropped away at line 56. Trapezoidal-shaped lead arrays 24' are not otherwise depicted in the drawings, but would appear similarly to lead arrays 24 in FIG. 1 except wider at their outside edges.

Slots 52 may be shaped to permit the presence of an alignment mechanism, which may be, but is not limited to, tabs 26 bearing holes 28. Because slots 52' are differently shaped, tabs 26' would have a triangular shape and alignment holes 28' would be spaced somewhat wider apart.

It will be appreciated, however, that the slots 52 may be considered optional, though they may be preferred in some applications. For example, a device 10 is anticipated where slots 52 are not present, but the portions of the substrate that might occupy the space where slots 52 might be are simply folded or telescoped inward to permit the lead arrays 24 to be formed or "downwardly" extended to permit the outer bonding areas 50 to contact the PCB bonding lands 16.

Figure 3:
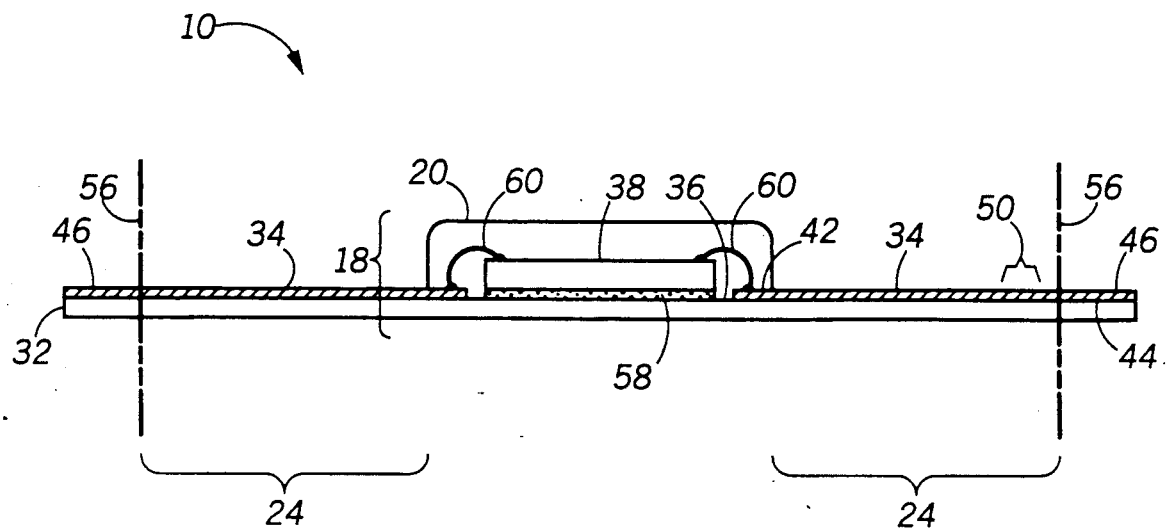
FIG. 3 is a cross-sectional view of a thin electronic device after molding in accordance with the method of the present invention.

Shown in FIG. 3 is a cross-sectional profile of a thin electronic device 10 of this invention under construction. Similar parts will have the same reference numbers, and the construction of the device 10 will be described. Substrate 32 is provided and bears a plurality of traces 34 seen edge-on having inner bonding areas 42, outer bonding areas 50 and test points 46 at the terminals of traces 34. Integrated circuit die 38 is next placed on the integrated circuit die receiving area 36 and die bonded thereto by a suitable adhesive 58. Bonding pads 40 (not visible in this view) are next electrically connected to inner bonding areas 42 by any suitable means, including, but not limited to, wire bonds 60, tape automated bonding (TAB), "flip chip" bump bonding, etc.

For example, if direct bonding by flip chip techniques is desired, die bonding pads 40 would be provided with bumps of gold or other suitable material, inner bonding areas 42 would extend into the die receiving area 36 and the die 38 would be flipped over and directly bonded by thermocompression or other suitable technique to the inner bonding areas directly, which may also be bumped prior to bonding.

Figure 4:
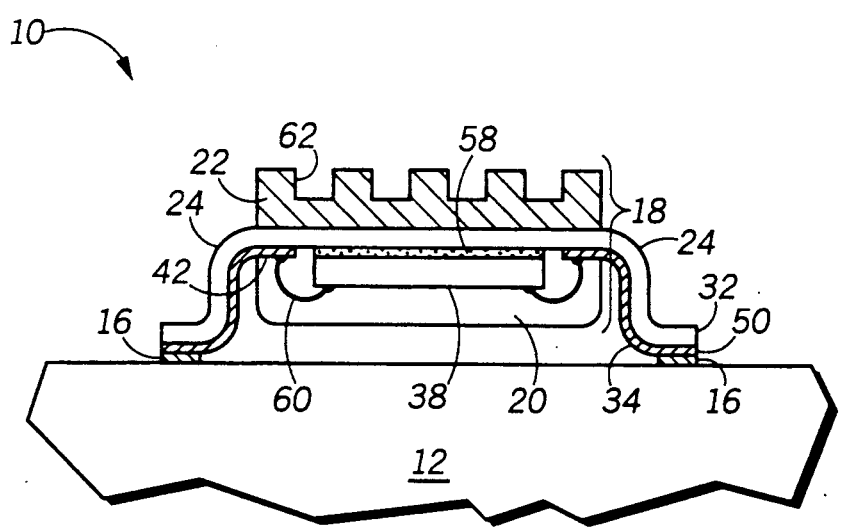
FIG. 4 is a cross-sectional illustration of the thin electronic device of FIG. 3 after the test points have been sheared and the traces formed for surface mounting on a PCB.

The device 10 may then be provided with a package body 18, which, in the embodiment seen in FIGS. 3 and 4, comprises an overmolded base 20. Base 20 covers at least the integrated circuit die 38, the inner bonding areas 42 and wire bonds 60. At this point in the manufacturing process, the device 10 is oriented on its top or upside-down from the position in which it will be mounted to a PCB 12, so although the "base" 20 is depicted on the top in FIG. 3, it will eventually form the bottom of the device 10 in FIG. 4. Body 18 may be provided in other ways besides over-molding, such as enclosing the device with pre-formed piece parts, etc.

The device may now be tested by contacting test probes with test points 46. Testing may occur prior to providing the body 48 as well. Being able to test the integrated circuit die 38 and its connections 60 to traces 34 before the device 10 is completely formed has the advantage of being able to discard or rework defective device 10 and chip 38 before additional value is added to the device 10 by subsequent steps.

After the device 10 is tested, the substrate 32 peripheries 44 and corners 48 which form the surrounding carrier structure are severed along crop line 56. The slots 52, which are not visible in FIGS. 3 and 4, may be formed at many places in the device 10 fabrication process including, but not necessarily limited to, before the die 38 is mounted to the substrate 32, after the overmolding step, and during or after the cropping along line 56. However, slots 52, if needed, must be present prior to the forming of at least the parts of substrate 32 and traces 34 (including outer bonding areas 50) into lead arrays 24 by bending and shaping. It is apparent that the resulting lead arrays 24 are separated by the slots 52 and that arrays 24 extend outside of and away from package body 18.

The portions of traces 34 outside body 18 and including outer bonding areas 50 (lead arrays 24) may be formed into any suitable shape, such as the gull-wing configuration seen in FIG. 4, that will enable the outer bonding areas 50 to meet with and be bonded to the bonding lands 16 on PCB 12. Other configurations include, but are not necessarily limited to butt joint and J-lead configurations. If lead arrays 24 are formed into a gull wing configuration, the package 10 must be inverted from the orientation of FIG. 3 which is probably more convenient for manufacture, to that position seen in FIG. 4. An alternate embodiment would be to have the thin, flexible substrate 32 bear conductive traces 34 on both sides, which sets of traces are in electrical contact with each other. With such a substrate, the die 38 could be mounted on either side and either side of the arrays 24 could be used for bonding to the larger PCB substrate. With such a substrate 32, device 10 can be mounted to PCB substrate 12 in the position illustrated in FIG. 3.

The actual bonding of the outer bonding areas 50 to the bonding lands 16 may be conducted by any suitable manner, including but not necessarily limited to, tinning the two surfaces with solder, thermocompression bonding, wave solder, hot bar reflow, etc. Device 10 may be optionally provided with a structure on the back side thereof or top in the orientation of FIG. 4, which may be a cap 22 that may be necessary in some instances to seal the package 10. Cap 22 may contain a heat dissipation surface 62, or may in its entirety be a heat sink. In a preferred embodiment, the cap 22 is placed or formed at the same time as the base 20. However, if a separate heat sink is to be provided, it may be desirable to place the heat sink on the package 10 at least after the device 10 is tested to avoid unnecessarily affixing heat sinks to defective packages.

It will be apparent that the lead arrays 24 will provide considerable flexibility and stress relief as the device 10 is handled, mounted on PCB 12, and while it is on the board 12 itself. Additionally, the substrate 32 and the PCB 12 can be better matched for thermal expansion properties to also reduce the stress. Further, because the traces 34 and outer bonding areas 50 are ganged together on a lead array 24, only one alignment need be made per device 10 side to ensure the alignment of all of the connections. The device 10 may also be tested at a larger pitch at test points 46 than the pitch available at lead areas 50. Bent lead and coplanarity problems are greatly reduced by the use of lead arrays 24. The device 10 can be made very thinly and can be readily surface mounted. The test points 46, peripheries 44 and corners 48 form a structure around the substrate 12 that will protect it during handling and testing. Damage that may occur to these regions during handling and testing is insignificant since this portion will be excised and discarded after testing and prior to mounting to the PCB 12.

Figure 5:
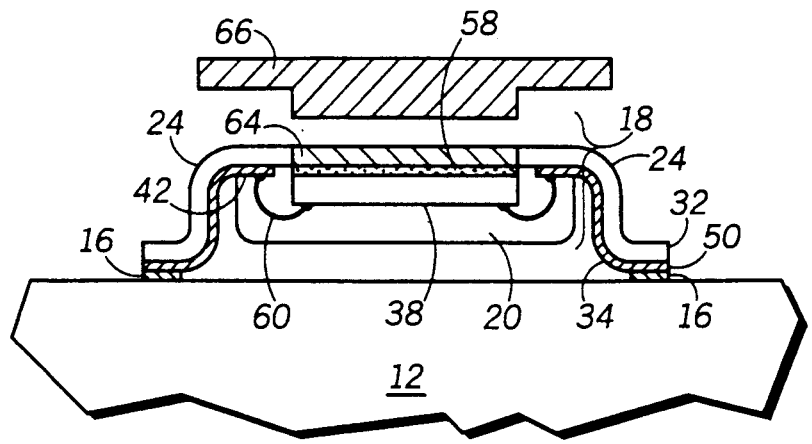
FIG. 5 is a cross-sectional view of an electronic device such as that seen in FIG. 4, but which has been optimized for thermal dissipation.

Shown in FIG. 5 is an embodiment of the invention where the IC die receiving area 36 is replaced by a thermally conductive die support 64 to which the die 38 is bonded. To further facilitate the thermal dissipation from device 10, a heat spreader or heat sink 66 may be provided and attached to thermally conductive die support 64.

Figure 6:
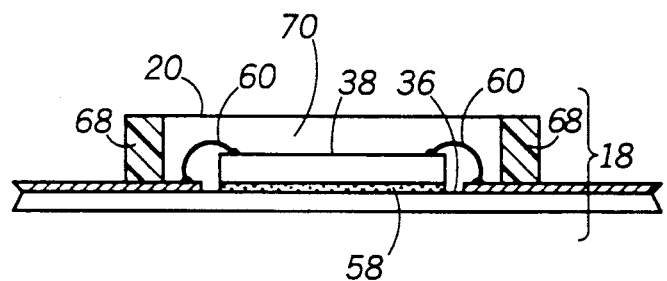
FIGS. 6 and 7 are partial cross-sectional illustrations of devices of the present invention with alternate body types.
Figure 7:
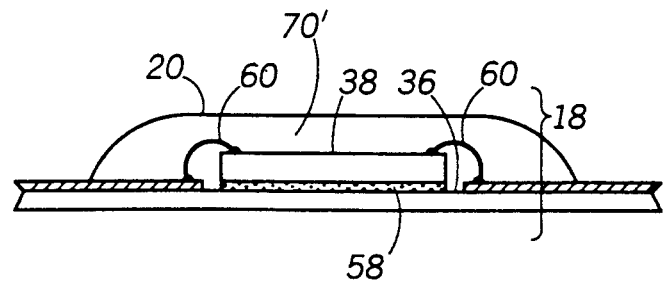

FIGS. 6 and 7 show alternate body 18 configurations to those discussed before. In FIG. 6, resin dams 68 are provided, which may be a suitable insulative, protective material. Resin dams 68 may be molded in place on the substrate 32, or may be premolded and placed in a separate step. Resin 70 is then provided to fill the space between dams 68. Resin 70 is preferably an insulative material that is viscous upon placement, but which hardens over time or the application of heat. Suitable resins include, but are not limited to epoxies. The body 18 may be finished by just applying the resin in bulk form 70' without using dams 68, as seen in FIG. 7. Such an application of resin is sometimes called "glob top".

Many modifications may be made in the structure and process of the present invention without departing from the scope of thereof. For example, the various features of the invention may be combined in a way not explicitly illustrated herein. Although TAB interconnection is not explicitly shown, it may certainly be used. Additionally, substrate 32 may be made from a transparent material permitting inspection of the bonds made on bonding lands 16. If substrate 32 were transparent, point-to-point localized laser fusing techniques could be used to make each of the connections. It is intended that all such modifications be included within the invention as fall within the scope of the appended claims.

I claim:

1. A method for making an electronic device suitable for surface mounting on a printed circuit board (PCB) having bonding lands comprising:
   providing an insulative, flexible substrate having a periphery, where the substrate has an electronic component receiving area thereon; and where the substrate additionally has a plurality of electrically conductive traces thereon extending from the electronic component receiving area to the periphery, where the traces have
      inner bonding areas near the electronic component receiving area; and
      outer bonding areas near the periphery;
   affixing an electronic component having a plurality of bonding pads thereon to the electronic component receiving area on the substrate;
   electrically connecting the bonding pads to the inner bonding areas;
   surrounding at least the electronic component and the inner bonding areas with a package body;
   providing slots in the flexible substrate to separate the plurality of traces into at least two groups of traces, each of the groups being fully supported along the entire length of the traces by the flexible substrate, and each of the groups being provided with means for aligning the traces of the group to lands on a PCB; and
   forming the at least two groups of traces into lead arrays to permit the outer bonding areas to contact and be bonded as a group to the bonding lands on a PCB.

2. The method of claim 1 further comprising the step of providing a test point along each trace, where the test point is at the substrate periphery further removed from the electronic component receiving area than the outer bonding areas, and where the device is tested by probing the test points after the electronic component is electrically connected to the inner bonding areas.

3. The method of claim 2 further comprising the step of severing the test points and periphery from the portion of the substrate containing the outer bonding areas and the package body after the device is tested.

4. The method of claim 1 further comprising the steps of surface mounting the device to a PCB, and where after the forming of the lead arrays, the device is aligned to the PCB with the means for aligning on at least one of the lead arrays and the traces of the group are bonded to the lands of the PCB as a group.

5. A method for making an electronic device suitable for surface mounting on a printed circuit board (PCB) having bonding lands comprising:
   providing an insulative, flexible substrate having a periphery, where the substrate has an electronic component receiving area thereon; and where the substrate additionally has a plurality of electrically conductive traces thereon extending from the electronic component receiving area to the periphery, where the traces have
      inner bonding areas near the electronic component receiving area;
      outer bonding areas near the periphery; and
      test points, where the test point is at the substrate periphery further removed from the electronic component receiving area than the outer bonding areas;
   affixing an electronic component having a plurality of bonding pads thereon to the electronic component receiving area on the substrate;

electrically connecting the bonding pads to the inner bonding areas;

surrounding at least the electronic component and the inner bonding areas with a package body;

testing the package by probing the test points after the electronic component is surrounded with the package body;

providing slots in the flexible substrate to separate the plurality of traces into at least two groups of traces, each of the groups being fully supported along the entire length of the traces by the flexible substrate, and each of the groups being provided with means for aligning the traces of the group to lands on a PCB;

forming the at least two groups of traces into lead arrays to permit the outer bonding areas to contact and be bonded to the bonding lands on a PCB; and severing the substrate periphery containing the test points from the substrate having the outer bonding areas and the package body.

6. The method of claim 5 further comprising the steps of surface mounting the device to a PCB, and where after the forming of the lead arrays, the device is aligned to the PCB with the means for aligning on at least one of the lead arrays and the traces of the group are bonded to the lands of the PCB.

* * * * *